United States Patent
Kim et al.

(10) Patent No.: US 6,851,085 B2
(45) Date of Patent: Feb. 1, 2005

(54) APPARATUS AND METHOD FOR GENERATING (N, 3) CODE AND (N, 4) CODE USING SIMPLEX CODES

(75) Inventors: Jae-Yoel Kim, Kunpo-shi (KR); Sung-Oh Hwang, Yongin-sih (KR)

(73) Assignee: Samsung Electronics Co., Ltd. (KR)

( * ) Notice: Subject to any disclaimer, the term of this patent is extended or adjusted under 35 U.S.C. 154(b) by 418 days.

(21) Appl. No.: 09/974,640

(22) Filed: Oct. 9, 2001

(65) Prior Publication Data

US 2002/0066060 A1 May 30, 2002

(30) Foreign Application Priority Data

Oct. 6, 2000 (KR) .......................................... 2000-58966

(51) Int. Cl.$^7$ .............................................. H03M 13/00
(52) U.S. Cl. ...................... 714/779; 714/774; 714/776; 714/757
(58) Field of Search ................................ 714/779, 757, 714/774, 770, 761, 762

(56) References Cited

U.S. PATENT DOCUMENTS

| | | | | |
|---|---|---|---|---|
| 6,341,125 B1 | * | 1/2002 | Hong et al. | .................. 370/335 |
| 6,732,316 B1 | * | 5/2004 | Tong et al. | .................. 714/756 |
| 2002/0010893 A1 | * | 1/2002 | Kim et al. | .................. 714/790 |

* cited by examiner

*Primary Examiner*—Joseph D Torres
(74) *Attorney, Agent, or Firm*—Dilworth & Barrese, LLP

(57) ABSTRACT

An apparatus and method for generating a (n, 3) code and a (n, 4) code using simplex codes are disclosed. To encode a 3-bit information bit stream to a (n, 3) codeword with n code symbols, a simplex encoder generates a first-order Reed-Muller codeword with (P+1) code symbols from the input information bit stream for n>P, and punctures the first code symbol of the (P+1) first-order Reed-Muller code symbols to produce a (P, 3) simplex codeword. An interleaver permutates the P code symbols of the (P, 3) simplex codeword by columns according to a predetermined pattern. A repeater repeats the column-permutated (P, 3) simplex codeword until the number of repeated codes is n and outputs a (n, 3) codeword with the n repeated code symbols.

12 Claims, 4 Drawing Sheets

APPARATUS AND METHOD FOR GENERATING (N, 3) CODE AND (N, 4) CODE USING SIMPLEX CODES

PRIORITY

This application claims priority to an application entitled "Apparatus and Method for Generating (n, 3) Code and (n, 4) Code Using Simplex Codes" filed in the Korean Industrial Property Office on Oct. 6, 2000 and assigned Ser. No. 2000-58966, the contents of which are hereby incorporated by reference.

BACKGROUND OF THE INVENTION

1. Field of the Invention

The present invention relates generally to a mobile communication system, and in particular, to an apparatus and method for generating a (n, 3) code and a (n, 4) code using simplex codes.

2. Description of the Related Art

In general, the CDMA (Code Division Multiple Access)-based future mobile telecommunication system known as "IMT 2000" transmits data for voice service and picture service, and control data necessary to provide those services. The ability to minimize errors generated during data transmission is crucial to improvement of service quality. For this purpose, error correcting codes are used to correct data bit errors. The purpose of using the error correcting is to minimize data bit rates in transmission data, and so, it is important to use optimal error correcting codes.

Linear codes are typically used as error correcting codes because performance analysis is a relatively simple process. The performance of the linear codes is measured by a Hamming distance distribution in the error correcting codewords. The Hamming distance is defined as the number of non-zero symbols in each codeword. For a codeword "0111", its Hamming distance is 3. The smallest Hamming distance is called a minimum distance. As the minimum distance of codewords is increased, the error correction performance of the codewords is also increased. Accordingly, an optimal code is a codeword with a minimum distance, and thus, optimum error correction performance.

For details of a minimum distance between codes according to the input and output of binary linear codes to make the binary linear codes optimal for the length of code symbols encoded from an input information bit stream, see "An Updated Table of Minimum-Distance Bounds for Binary Linear Codes", A. E. Brouwer and Tom Verhoeff, IEEE Transactions on Information Theory, Vol. 39, No. 2, March 1993.

In a (n, k) block code, n is the number of code symbols and k is the number of input information bits. The coding rate of the (n, k) block code is k/n.

If k is 3 or 4, a different encoder is used to generate the (n, 3) or (n, 4) code at a different coding rate. Thus, the use of multiple encoders for generating the (n, 3) code or (n, 4) code results in an increase in the structural complexity and increased size of the encoders and decoders.

SUMMARY OF THE INVENTION

It is, therefore, an object of the present invention to provide an apparatus and method for generating (n, 3) codes with an optimal minimum distance irrespective of the coding rates.

It is also an object of the present invention to provide an apparatus and method for generating (n, 4) codes with an optimal minimum distance irrespective of the coding rates.

It is another object of the present invention to provide an encoding apparatus and method for generating (n, 3) codes or (n, 4) codes irrespective of the coding rates.

It is a further object of the present invention to provide an apparatus and method for generating (n, 3) codes with an optimal minimum distance irrespective of the coding rates according to a predetermined interleaving pattern.

It is still another object of the present invention to provide an apparatus and method for generating (n, 4) codes with an optimal minimum distance irrespective of the coding rates according to a predetermined interleaving pattern.

It is yet another object of the present invention to provide an apparatus and method for decoding a signal coded by an (n, 3) encoder.

It is also yet another object of the present invention to provide an apparatus and method for decoding a signal coded by an (n, 4) encoder.

The foregoing and other objects are achieved by providing an apparatus and method for generating a (n, 3) code and a (n, 4) code using simplex codes are disclosed.

According to one aspect of the present invention, to encode a 3-bit information bit stream to a (n, 3) codeword with n code symbols in the encoding apparatus, a simplex encoder generates a first-order Reed-Muller codeword with (P+1) code symbols from the input information bit stream for n>P, and punctures the first code symbol of the (P+1) first-order Reed-Muller code symbols to produce a (P, 3) simplex codeword. An interleaver permutates the P code symbols of the (P, 3) simplex codeword by columns according to a predetermined pattern. A repeater repeats the column-permutated (P, 3) codeword under a predetermined control and outputs a (n, 3) codeword with n repeated code symbols.

According to another aspect of the present invention, to encode a 3-bit information bit stream to a (n, 3) codeword with n code symbols in the encoding method, a first-order Reed-Muller codeword with (P+1) code symbols is first generated from the input information bit stream for n>P and the first code symbol of the (P+1) first-order Reed-Muller code symbols is punctured to produce a (P, 3) simplex codeword. The P code symbols of the (P, 3) simplex codeword are permutated by columns according to a predetermined pattern. The column-permutated (P, 3) codeword is repeated under a predetermined control and as a result, a (n, 3) codeword with n repeated code symbols is produced.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

Figure 1:
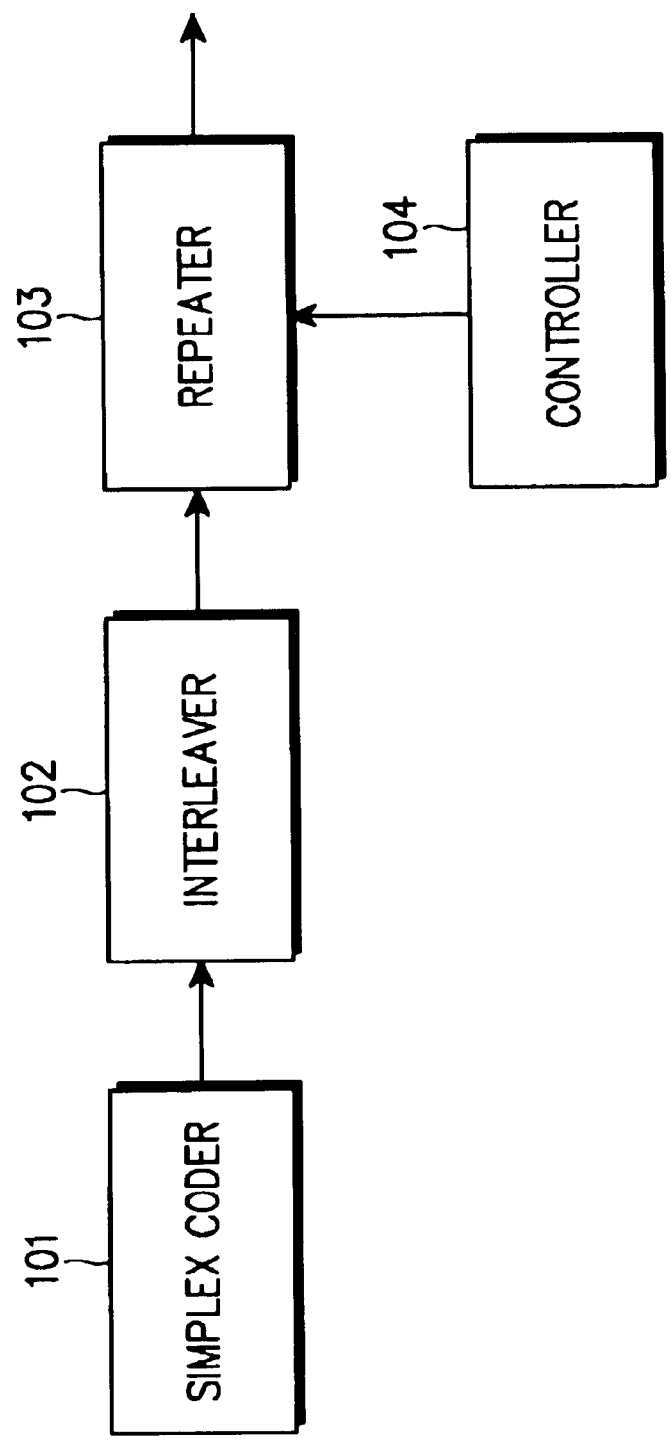
FIG. 1 is a block diagram of an encoding apparatus for generating (n, 3) codes and (n, 4) codes according to the present invention.

FIG. 1 is a block diagram of an encoding apparatus for generating (n, 3) codes and (n, 4) codes according to the present invention. There will be given a description of generating (n, 3) codes and (n, 4) codes with reference to FIG. 1.

Concerning generation of a (n, 3) code, a simplex encoder 101 generates a simplex codeword. The simplex codeword is produced by puncturing the first column of (m×m) first-order Reed-Muller codes. From ($2^k$, k) first-order Reed-Muller codes, the simplex codewords take the form of ($2^k$-1, k). To generate the (n, 3) codes, (7, 3) simplex codewords are required. Table 1 below lists (8, 3) first-order Reed-Muller codes and (7, 3) simplex codewords are produced by puncturing the first column, i.e., bold code symbols of the first-order Reed-Muller codes.

TABLE 1

| W0 | 0 | 0 | 0 | 0 | 0 | 0 | 0 | 0 |
|---|---|---|---|---|---|---|---|---|
| W1 | 0 | 1 | 0 | 1 | 0 | 1 | 0 | 1 |
| W2 | 0 | 0 | 1 | 1 | 0 | 0 | 1 | 1 |
| W3 | 0 | 1 | 1 | 0 | 0 | 1 | 1 | 0 |
| W4 | 0 | 0 | 0 | 0 | 1 | 1 | 1 | 1 |
| W5 | 0 | 1 | 0 | 1 | 1 | 0 | 1 | 0 |
| W6 | 0 | 0 | 1 | 1 | 1 | 1 | 0 | 0 |
| W7 | 0 | 0 | 0 | 0 | 1 | 1 | 1 | 1 |

The simplex encoder 101 that generates simplex codewords from first-order Reed-Muller codes, as seen from Table 1, will be described with reference to FIG. 4.

Figure 4:
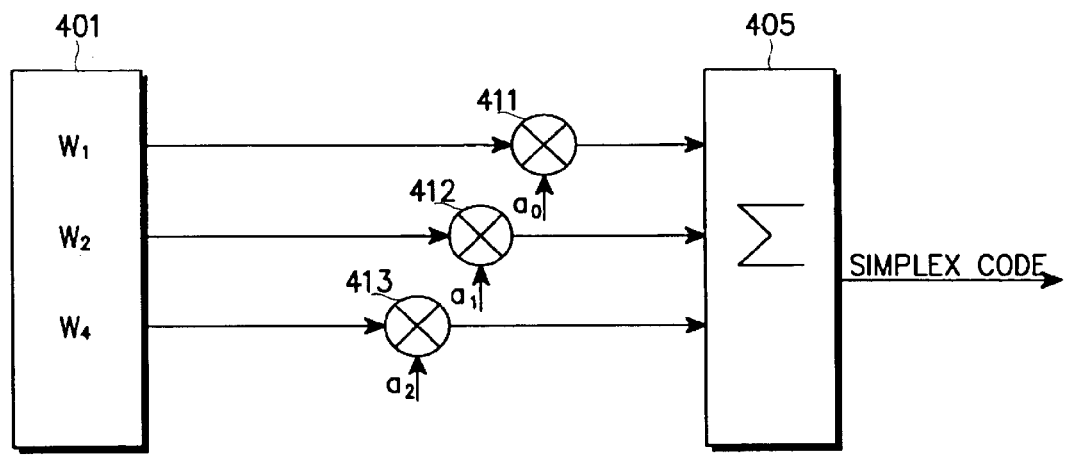
FIG. 4 is a block diagram of a simplex encoder for generating a (7, 3) code according to another embodiment of the present invention.

FIG. 4 is a block diagram of the simplex encoder for generating (7, 3) simplex codes according to an embodiment of the present invention. While a simplex encoder for generating (7, 3) simplex codes is separately provided in the embodiment of the present invention for the illustrative purposes, the simplex encoder may be replaced with a memory that stores the (7, 3) simplex codes shown in Table 1.

A first-order Reed-Muller basis code generator 401 generates first-order Reed-Muller basis codes W1, W2 and W4 for use in generating the first-order Reed-Muller codes W0 to W7. The leftmost code bits "0"s of the codes W1, W2 and W4 are punctured. The reason for using the punctured first-order Reed-Muller codes is to generate the simplex codewords. Multipliers 411, 412 and 413 multiply input information bits ($a_0$, $a_1$, $a_2$) by the codes W1, W2 and W4 with the leftmost code bits punctured to select some of the punctured first-order Reed-Muller basis codes necessary for generating a punctured code $W_j$ (j=0, 1, . . . , 7).

For example, if the information bits ($a_2$, $a_1$, $a_0$) are binary bits "101", the multipliers 411, 412 and 413 select W4 and W1 among the punctured first-order Reed-Muller basis codes to generate W5 corresponding to a decimal number "5" indicated by the input information bits. A summer 405 sums the first-order Reed-Muller basis codes selected by the information bits ($a_2$, $a_1$, $a_0$) and then generates a simplex codeword. That is, a first-order Reed-Muller code, which is selected to meet with each information bit constructed in the information bit stream, is added to thereby generate the simplex codeword.

The simplex encoder 101 outputs the (7, 3) simplex codeword to an interleaver 102. The interleaver 102 permutates the (7, 3) simplex codeword by columns according to a predetermined interleaving pattern. By the column permutation, the (7, 3) simplex codeword takes a particular form that makes the resulting code optimal for length n despite repetition of n code symbols. That is, the (7, 3) simplex codeword is converted to an optimal codeword by the column permutation.

To generate a (n, 3) code, the column permutation is carried out as follows.

$$[S_1, S_2, S_3, S_4, S_5, S_6, S_7] \rightarrow [S_1, S_2, S_4, S_7, S_3, S_5, S_6]$$

where $S_j$ (j=1, 2, . . . , 7) represents the $j^{th}$ symbol of the (7, 3) simplex code. The permutated, i.e., reordered simplex code shows optimal performance for length n even though it is split by length n. Herein, the column permutation performed in the interleaver 102 is the process of reordering an input simplex code (7,3) to have an optimal weight distribution for all the length n being repeatedly generable, i.e., to realize that the (n,3) code should be an optimal code regardless of a length n.

The column-permutated simplex code is applied to the input of a repeater 103. The repeater 103 repeats the column-permutated (7, 3) simplex code under the control of the controller 104. The controller 104 controls the repeater 103 to output permutated (7,3) simplex code symbols which are sequentially repeated according to n.

For a better understanding of the operations of the repeater 103 and the controller 104, generation of a (10, 3) code will be described as an example.

The repeater 103 repeats the column-permutated (7, 3) simplex code sequentially, i.e., in the order of $S_1$, $S_2$, $S_4$, $S_7$, $S_3$, $S_5$, $S_6$, $S_1$, $S_2$, $S_4$, $S_7$, $S_3$, $S_5$, $S_6$ . . . . And, as the n of the (n,3) code is 10, i.e., (n,3) is (10,3), the controller 104 controls the repeater 103 to have a length 10. That is, the controller 104 controls the output of the repeater 103 to be only $S_1$, $S_2$, $S_4$, $S_7$, $S_3$, $S_5$, $S_6$, $S_1$, $S_2$, $S_4$. Thus, output codes of the repeater 103 are generated in a manner that the permutated (7,3) simplex code for k=3 is sequentially repeated until the number of repeated codes is n. That is, the controller 104 controls output signals of the repeater 103 to correspond to a length n of a (n,3) code and therefore, the output of the repeater 103 for k=3 is always an optimal code regardless of a length n.

Figure 2:
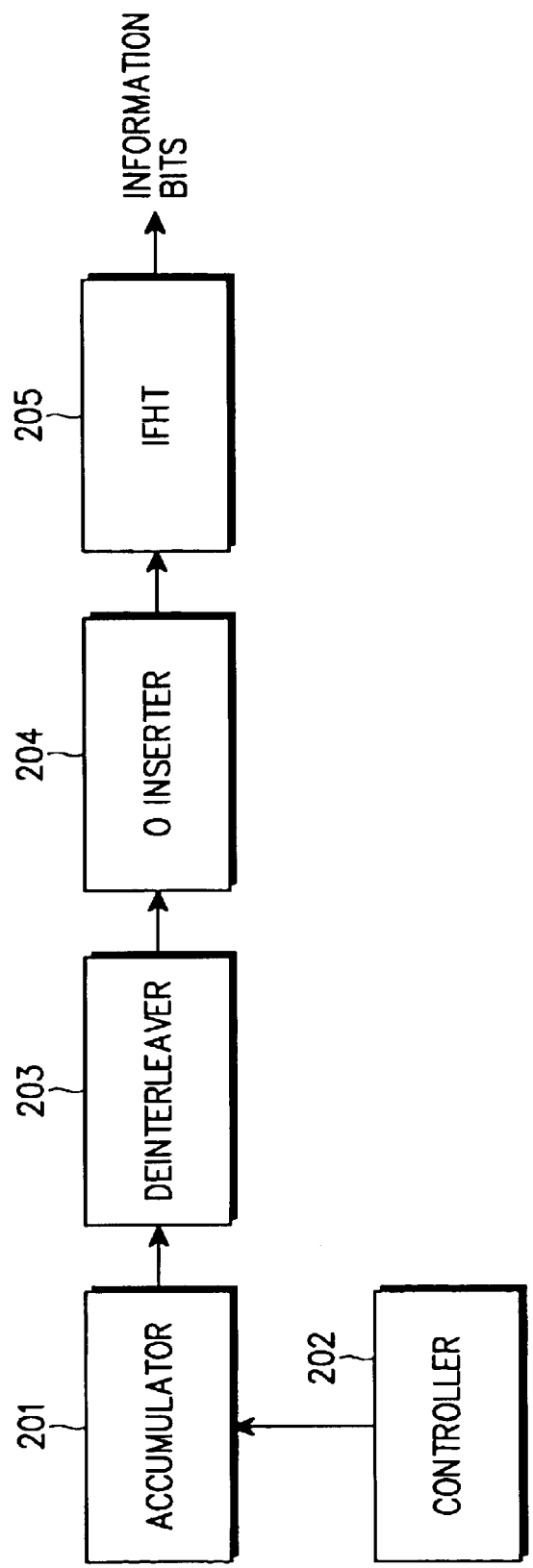
FIG. 2 is a block diagram of a decoding apparatus for decoding (n, 3) codes and (n, 4) codes according to the present invention.

FIG. 2 is a block diagram of a decoding apparatus for decoding a (n, 3) code and a (n, 4) code according to the present invention. With reference to FIG. 2, decoding the (n, 3) code and decoding the (n, 4) code will be respectively described below.

Concerning decoding a (n, 3) code, a (n, 3) code output from the repeater 103 shown in FIG. 1 is applied to the input of an accumulator 201. The accumulator 201 operates under the control of a controller 202. If a code received from the encoder is a (n, 3) code, the controller 202 controls the accumulator 201 to split the (n, 3) code symbols on a seven-symbol basis and accumulate the repeated symbols. The accumulator 201 converts the accumulated (n, 3) code to a (7, 3) simplex code. A deinterleaver 203 recovers the permutated (7, 3) simplex code to the original code symbol order by permutating reversely and outputs the recovered (7, 3) simplex code to a zero inserter 204. The deinterleaver 203 can perform the reverse column permutation because the column permutation rule is preset between the interleaver 102 and the deinterleaver 203.

The (7, 3) code is reversely column-permutated according to the deinterleaving pattern of $$[S_1, S_2, S_4, S_7, S_3, S_5, S_6] \rightarrow [S_1, S_2, S_3, S_4, S_5, S_6, S_7]$$

The zero inserter 204 converts the reverse-column-permutated (7, 3) simplex code to a first-order Reed-Muller code by inserting 0 before the leftmost code symbol of the reverse-column permutated (7, 3) simplex code received from the deinterleaver 203. An inverse fast Hadamard Transformer 205 decodes the (8, 3) first-order Reed-Muller code to the input information bits ($a_0$, $a_1$, $a_2$) through inverse fast Hadamard transformation of the (8, 3) first-order Reed-Muller code. The inverse fast Hadamard transformation has the advantages of fast decoding of a first-order Reed-Muller code and reduced complexity of a decoding hardware structure for the first-order Reed-Muller code.

Now a description will be made of generation of a (n, 4) code referring to FIG. 1.

The simplex encoder 101 generates a simplex codeword. The simplex codeword is produced from a (m×m) first-order Reed-Muller code by puncturing the first column. A ($2^k$-1, k) simplex code is generated from a ($2^k$, k) first-order Reed-Muller code.

of the punctured first-order Reed-Muller basis codes necessary for generating a punctured code $W_j$ (j=0, 1, . . . , 15).

For example, if the information bits ($a_3$, $a_2$, $a_1$, $a_0$) are binary bits "1001", the multipliers 511 to 514 select W8 and W1 among the punctured first-order Reed-Muller basis codes to generate W9 corresponding to a decimal number "9" indicated by the input information bits. A summer 505 sums the first-order Reed-Muller basis codes selected by the information bits ($a_3$, $a_2$, $a_1$, $a_0$) and then generates a simplex codeword.

The simplex encoder 101 outputs the (15, 4) simplex codeword to the interleaver 102. The interleaver 102 permutates the (15, 4) simplex codeword by columns. By the column permutation, the (15, 4) simplex codeword takes a particular form that makes the resulting code optimal for length n despite repetition of n code symbols.

The interleaver 102 carries out column permutation on the (15, 4) simplex codeword according to the interleaving pattern of $$[S_1, S_2, S_3, S_4, S_5, S_6, S_7, S_8, S_9, S_{10}, S_{11}, S_{12}, S_{13}, S_{14}, S_{15}] \rightarrow$$
$$[S_1, S_2, S_4, S_8, S_{14}, S_{13}, S_{11}, S_7, S_5, S_3, S_{12}, S_{10}, S_{15}, S_9, S_6]$$

Except the case where n mod 15=5 (i.e., n=5, 20, 35, 50, . . . ), (n, 4) codes with optimal performance for n can be generated by column permutation. In case of n mod 15=5, (n, 4) codes are generated, which have a minimum distance different from that of the optimal codes of length n by 1.

TABLE 2

(16, 4) first-order Reed-Muller codes and (15, 4) simplex codes

| W0  | 0 | 0 | 0 | 0 | 0 | 0 | 0 | 0 | 0 | 0 | 0 | 0 | 0 | 0 | 0 | 0 |
|-----|---|---|---|---|---|---|---|---|---|---|---|---|---|---|---|---|
| W1  | 0 | 1 | 0 | 1 | 0 | 1 | 0 | 1 | 0 | 1 | 0 | 1 | 0 | 1 | 0 | 1 |
| W2  | 0 | 0 | 1 | 1 | 0 | 0 | 1 | 1 | 0 | 0 | 1 | 1 | 0 | 0 | 1 | 1 |
| W3  | 0 | 1 | 1 | 0 | 0 | 1 | 1 | 0 | 0 | 1 | 1 | 0 | 0 | 1 | 1 | 0 |
| W4  | 0 | 0 | 0 | 0 | 1 | 1 | 1 | 1 | 0 | 0 | 0 | 0 | 1 | 1 | 1 | 1 |
| W5  | 0 | 1 | 0 | 1 | 1 | 0 | 1 | 0 | 0 | 1 | 0 | 1 | 1 | 0 | 1 | 0 |
| W6  | 0 | 0 | 1 | 1 | 1 | 1 | 0 | 0 | 0 | 0 | 1 | 1 | 1 | 1 | 0 | 0 |
| W7  | 0 | 1 | 1 | 0 | 1 | 0 | 0 | 1 | 0 | 1 | 1 | 0 | 1 | 0 | 0 | 1 |
| W8  | 0 | 0 | 0 | 0 | 0 | 0 | 0 | 0 | 1 | 1 | 1 | 1 | 1 | 1 | 1 | 1 |
| W9  | 0 | 1 | 0 | 1 | 0 | 1 | 0 | 1 | 1 | 0 | 1 | 0 | 1 | 0 | 1 | 0 |
| W10 | 0 | 0 | 1 | 1 | 0 | 0 | 1 | 1 | 1 | 1 | 0 | 0 | 1 | 1 | 0 | 0 |
| W11 | 0 | 1 | 1 | 0 | 0 | 1 | 1 | 0 | 1 | 0 | 0 | 1 | 1 | 0 | 0 | 1 |
| W12 | 0 | 0 | 0 | 0 | 1 | 1 | 1 | 1 | 1 | 1 | 1 | 1 | 0 | 0 | 0 | 0 |
| W13 | 0 | 1 | 0 | 1 | 1 | 0 | 1 | 0 | 1 | 0 | 1 | 0 | 0 | 1 | 0 | 1 |
| W14 | 0 | 0 | 1 | 1 | 1 | 1 | 0 | 0 | 1 | 1 | 0 | 0 | 0 | 0 | 1 | 1 |
| W15 | 0 | 1 | 1 | 0 | 1 | 0 | 0 | 1 | 1 | 0 | 0 | 1 | 0 | 1 | 1 | 0 |

The simplex encoder 101 that generates simplex codewords from first-order Reed-Muller codes, as seen from Table 2, will be described with reference to FIG. 5.

Figure 5:
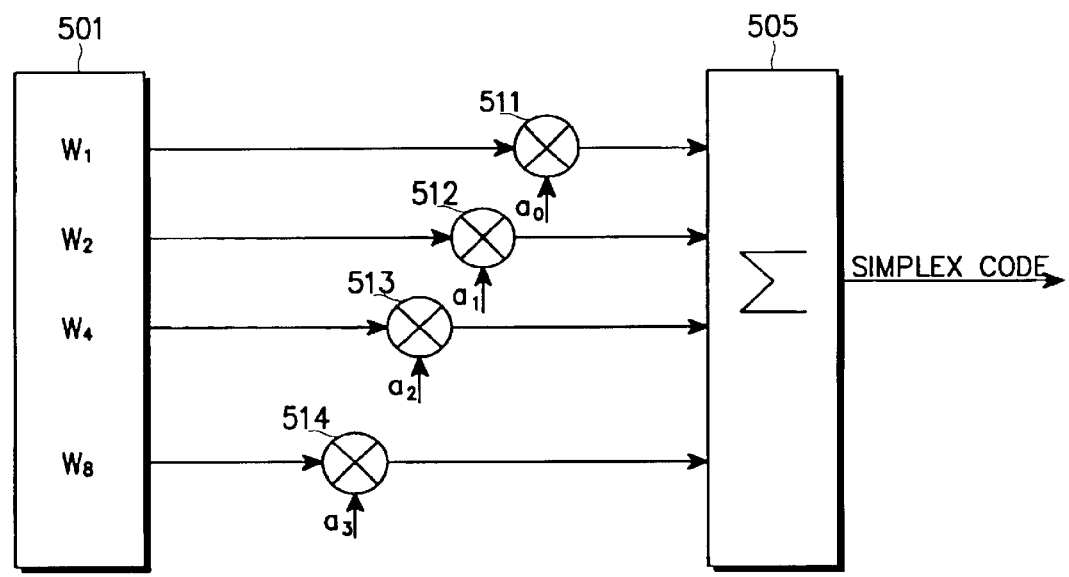
FIG. 5 is a block diagram of a simple encoder for generating a (15, 4) code according to the second embodiment of the present invention.

FIG. 5 is a block diagram of the simplex encoder for generating (15, 4) simplex codes according to the embodiment of the present invention. While a simplex encoder for generating (15, 4) simplex codes is separately provided in the embodiment of the present invention for the illustrative purposes, the simplex encoder may be replaced with a memory that stores the (15, 4) simplex codes shown in Table 2.

A first-order Reed-Muller basis code generator 501 generates first-order Reed-Muller basis codes W1, W2, W4 and W8 for use in generating the first-order Reed-Muller codes W0 to W15. The leftmost code bits "0"s of the codes W1, W2, W4 and W8 are punctured. The reason for using the punctured first-order Reed-Muller codes is to simplex codewords. W8 is additionally used to generate (n, 4) codes in the (n, 3) code generator. Multipliers 511 to 514 multiply input information bits ($a_0$, $a_1$, $a_2$, $a_3$) by the codes W1, W2, W4 and W8 with the leftmost code bits punctured to select some Herein, the column permutation performed in the interleaver 102 is the process of reordering the input (15,4) simplex codes to have an optimal weight distribution for all the length n being repeatedly generable, i.e., to have an optimal (n,4) code irrespective of the length n.

The column-permutated simplex code is applied to the input of the repeater 103. The repeater 103 repeats the column-permutated (15, 4) simplex code under the control of the controller 104. The controller 104 controls the repeater 103 to output permutated (15,4) simplex code symbols which are repeated according to n.

For better understanding of the operations of the repeater 103 and the controller 104 concerning the (n, 4) code, generation of a (20, 4) code will be described as an example. The repeater 103 repeats the column-permutated (15, 4) simplex code sequentially, i.e., in the order of $S_1$, $S_2$, $S_4$, $S_8$, $S_{14}$, $S_{13}$, $S_{11}$, $S_7$, $S_5$, $S_3$, $S_{12}$, $S_{10}$, $S_{15}$, $S_9$, $S_6$, $S_1$, $S_2$, $S_4$, $S_8$, $S_{14}$, $S_{13}$, $S_{11}$, $S_7$, $S_5$, $S_3$, $S_{12}$, $S_{10}$, $S_{15}$, $S_9$, $S_6$ . . . . And, as n of the (n,4) is 20, i.e., (n,4) is (20,4), the controller 104 controls the repeater 103 to have a length 20. That is, the controller 104 controls the output of the repeater 103 to be only $S_1, S_2, S_4, S_8, S_{14}, S_{13}, S_{11}, S_7, S_5, S_3, S_{12}, S_{10}, S_{15}, S_9$, $S_6, S_1, S_2, S_4, S_8, S_{14}$. Thus, output codes of the repeater 103 is generated in a manner that the permutated (15,4) simplex code for k=4 is sequentially repeated until the number of repeated codes is n. That is, the controller controls output signals of the repeater 103 to correspond to a length n of a (n,4) code and therefore, the output of the repeater 103 for k=4 is always an optimal code regardless of a length n.

With reference to FIG. 2, decoding the (n, 4) code will be described below.

In operation, a (n, 4) code output from the repeater 103 shown in FIG. 1 is applied to the input of the accumulator 201. The accumulator 201 operates under the control of a controller 202. The controller 202 controls the accumulator 201 to split the (n, 4) code symbols on a 15-symbol basis and accumulate the repeated symbols. The accumulator 201 converts the accumulated (n, 4) code to a (15, 4) simplex code. The deinterleaver 203 recovers the permutated (15, 4) simplex code to the original code symbol order by permutating reversely and outputs the recovered (15, 4) simplex code to the zero inserter 204. The deinterleaver 203 can perform the reverse column permutation because the column permutation rule is preset between the interleaver 102 and the deinterleaver 203.

The (15, 4) code is reversely column-permutated according to the deinterleaving pattern of

[$S_1, S_2, S_4, S_8, S_{14}, S_{13}, S_{11}, S_7, S_5, S_3, S_{12}, S_{10}, S_{15}, S_9, S_6$]→
[$S_1, S_2, S_3, S_4, S_5, S_6, S_7, S_8, S_9, S_{10}, S_{11}, S_{12}, S_{13}, S_{14}, S_{15}$]

The zero inserter 204 converts the reverse-column-permutated (15, 4) simplex code to a first-order Reed-Muller code by inserting 0 before the leftmost code symbol of the reverse-column permutated (15, 4) simplex code received from the deinterleaver 203. The inverse fast Hadamard Transformer 205 decodes the (16, 4) first-order Reed-Muller code to the input information bits ($a_0, a_1, a_2, a_3$,) through inverse fast Hadamard transformation of the (16, 4) first-order Reed-Muller code. The inverse fast Hadamard transformation has the advantages of fast decoding of a first-order Reed-Muller code fast and reduced complexity of a decoding hardware structure for the first-order Reed-Muller code.

Now, a simplex encoder for generating a (15, 4) simplex code and a (7, 3) simplex code according to another embodiment of the present invention will be described below with reference to FIG. 3. It is obvious that the simplex encoder shown in FIG. 3 for illustrative purposes can be replaced by a memory that stores the information contained in Table 1 and Table 2.

Figure 3:
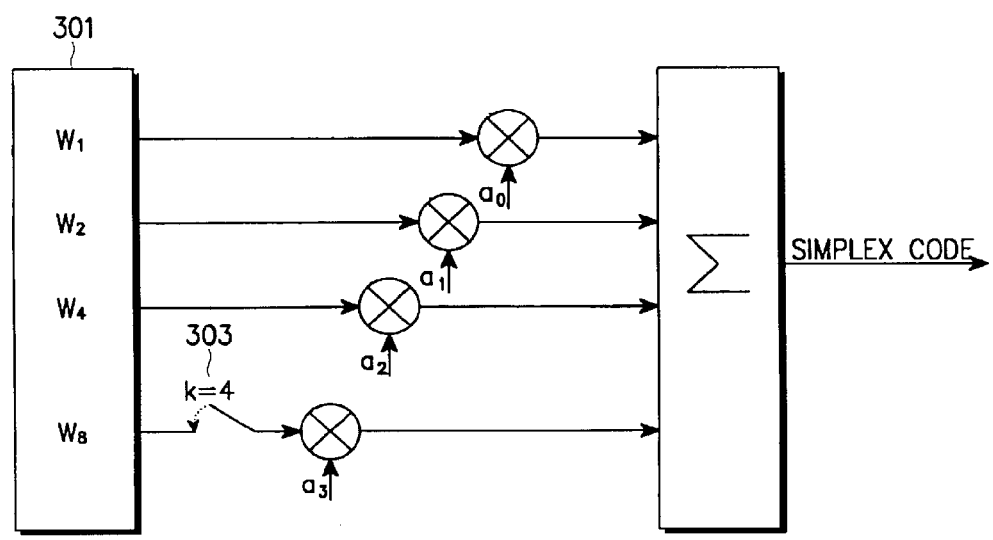
FIG. 3 is a block diagram of a simplex encoder for generating a (15, 4) code and a (7, 3) code according to an embodiment of the present invention.

FIG. 3 is a block diagram of a simplex encoder for generating a (15, 4) code and a (7, 3) code according to an embodiment of the present invention. Herein, it is noted that configuration for generating the (15,4) simplex code is the same as that of FIG. 5 stated above. In addition, configuration for generating the (7,3) simplex code is the same as that of FIG. 4 stated above. Accordingly, both the (7,3) and (15,4) simplex codes can be selectively generated by the switch 303. That is, in case of generating (15,4) simplex code, the controller 104 controls output of a first-order Reed-Muller basis code generator 301 to be W1, W2, W4 and W8 by switching on. Otherwise, only W1, W2 and W4 is selected for the first-order Reed-Muller basis code generator 301 by switching off. As such, detailed description for FIG. 3 is not mentioned herein below since the remaining configuration and operation other than the description of the switch 303 are all the same.

In accordance with the present invention as described above, (n, k) block codes with an optimal minimum distance can be generated with simplified hardware. Furthermore, use of the same hardware structure in generating codes at different coding rates, that is, for the input of different information bits reduces the number of required encoders, simplifies the encoder and decoder structures, and as a consequence, decreases their size.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for encoding a 3-bit information bit stream to a (n, 3) codeword with n code symbols, comprising:

a simplex encoder for generating a first-order Reed-Muller codeword with (P+1) code symbols from the 3-bit information bit stream for n>P, and puncturing the first code symbol of the (P+1) first-order Reed-Muller code symbols to produce a (P, 3) simplex codeword;

an interleaver for permutating the P code symbols of the (P, 3) simplex codeword by columns according to a predetermined pattern; and a repeater for repeating the column-permutated (P, 3) codewords until the number of repeated code symbols is n and outputting a (n, 3) codeword with the n repeated code symbols.

2. The apparatus of claim 1, wherein if k is 3, the (P, 3) simplex codeword is permutated by columns according to the pattern of

[$S_1, S_2, S_3, S_4, S_5, S_6, S_7$]→[$S_1, S_2, S_4, S_7, S_3, S_5, S_6$]

where $S_j$ represents $j^{th}$ code symbol in the (P, 3) simplex codeword.

3. An apparatus for encoding a 4-bit information bit stream to a (n, 4) codeword with n code symbols, comprising:

a simplex encoder for generating a first-order Reed-Muller codeword with (P+1) code symbols from the 4-bit information bit stream for n>P, and puncturing the first code symbol of the (P+1) first-order Reed-Muller code symbols to produce a (P, 4) simplex codeword;

an interleaver for permutating the P code symbols of the (P, 4) simplex codeword by columns according to a predetermined pattern; and a repeater for repeating the column-permutated (P, 4) codewords until the number of repeated code symbols is n and outputting a (n, 4) codeword with n repeated code symbols.

4. The apparatus of claim 3, wherein if k is 4, the (P, 4) simplex codeword is permutated by columns according to the pattern of

[$S_1, S_2, S_3, S_4, S_5, S_6, S_7, S_8, S_9, S_{10}, S_{11}, S_{12}, S_{13}, S_{14}, S_{15}$]→
[$S_1, S_2, S_4, S_8, S_{14}, S_{13}, S_{11}, S_7, S_5, S_3, S_{12}, S_{10}, S_{15}, S_9, S_6$]

where $S_j$ represents $j^{th}$ code symbol in the (P, 4) simplex codeword.

5. A method of encoding a 3-bit information bit stream to a (n, 3) codeword with n code symbols, comprising the steps of:

generating a first-order Reed-Muller codeword with (P+1) code symbols from the 3-bit information bit stream for n>P, and puncturing the first code symbol of the (P+1) first-order Reed-Muller code symbols to produce a (P, 3) simplex codeword;

permutating the P code symbols of the (P, 3) simplex codeword by columns according to a predetermined pattern; and repeating the column-permutated (P, 3) codewords until the number of repeated code symbol is n and outputting a (n, 3) codeword with the n repeated code symbols.

6. The method of claim 5, wherein if k is 3, the (P, 3) simplex codeword is permutated by columns according to the pattern of $$[S_1, S_2, S_3, S_4, S_5, S_6, S_7] \rightarrow [S_1, S_2, S_4, S_7, S_3, S_5, S_6]$$

where $S_j$ represents $j^{th}$ code symbol in the (P, 3) simplex codeword.

7. A method of encoding a 4-bit information bit stream to a (n, 4) codeword with n code symbols, comprising the steps of:

generating a first-order Reed-Muller codeword with (P+1) code symbols from the 4-bit information bit stream for n>P, and puncturing the first code symbol of the (P+1) first-order Reed-Muller code symbols to produce a (P, 4) simplex codeword;

permutating the P code symbols of the (P, 4) simplex codeword by columns according to a predetermined pattern; and repeating the column-permutated (P, 4) codewords until the number of repeated code symbols is n and outputting a (n, 4) codeword with the n repeated code symbols.

8. The method of claim 7, wherein if k is 4, the (P, 4) simplex codeword is permutated by columns according to the pattern of $$[S_1, S_2, S_3, S_4, S_5, S_6, S_7, S_8, S_9, S_{10}, S_{11}, S_{12}, S_{13}, S_{14}, S_{15}] \rightarrow$$
$$[S_1, S_2, S_4, S_8, S_{14}, S_{13}, S_{11}, S_7, S_5, S_3, S_{12}, S_{10}, S_{15}, S_9, S_6]$$

where $S_j$ represents $j^{th}$ code symbol in the (P, 4) simplex codeword.

9. An apparatus for encoding a 3-bit information bit stream to a (n, 3) codeword with n code symbols, comprising:

a memory for storing a first-order Reed-Muller codeword with (P+1) code symbols from the 3-bit information bit stream for n>P, and puncturing the first code symbol of the (P+1) first-order Reed-Muller code symbols to produce a (P, 3) simplex codeword;

an interleaver for permutating the P code symbols of the (P, 3) simplex codeword by columns according to a predetermined pattern; and a repeater for repeating the column-permutated (P, 3) simplex codewords until the number of repeated code symbols is n and outputting an optimal (n, 3) codeword with the n repeated code symbols.

10. The apparatus of claim 9, wherein if k is 3, the (P, 3) simplex codeword is permutated by columns according to the pattern of $$[S_1, S_2, S_3, S_4, S_5, S_6, S_7] \rightarrow [S_1, S_2, S_4, S_7, S_3, S_5, S_6]$$

where S represents each code symbol in the (P, 3) simplex codeword.

11. An apparatus for encoding a 4-bit information bit stream to a (n, 4) codeword with n code symbols, comprising:

a memory for storing a first-order Reed-Muller codeword with (P+1) code symbols from the 4-bit information bit stream for n>P, and puncturing the first code symbol of the (P+1) first-order Reed-Muller code symbols to produce a (P, 4) simplex codeword;

an interleaver for permutating the P code symbols of the (P, 4) simplex codeword by columns according to a predetermined pattern; and a repeater for repeating the column-permutated (P, 4) simplex codewords until the number of repeated code symbols is n and outputting an optimal (n, 4) codeword with the n repeated code symbols.

12. The apparatus of claim 11, wherein if k is 4, the (P, 4) simplex codeword is permutated by columns according to the pattern of $$[S_1, S_2, S_3, S_4, S_5, S_6, S_7, S_8, S_9, S_{10}, S_{11}, S_{12}, S_{13}, S_{14}, S_{15}] \rightarrow$$
$$[S_1, S_2, S_4, S_8, S_{14}, S_{13}, S_{11}, S_7, S_5, S_3, S_{12}, S_{10}, S_{15}, S_9, S_6]$$

where S represents each code symbol in the (P, 4) simplex codeword.

* * * * *